United States Patent [19]

Schellenberger et al.

[11] Patent Number: 6,132,811
[45] Date of Patent: Oct. 17, 2000

[54] PROCEDURE FOR THE DRYING OF SILICON

[75] Inventors: Wilhelm Schellenberger, Creussen; Dieter Herrmannsdörfer, Mistelgau, both of Germany

[73] Assignee: ICTOP Entwicklungs GmbH, Mistelgau, Germany

[21] Appl. No.: 09/008,029

[22] Filed: Jan. 16, 1998

Related U.S. Application Data

[60] Division of application No. 08/692,169, Aug. 5, 1996, Pat. No. 5,714,203, which is a continuation-in-part of application No. 08/667,388, Jun. 21, 1996, abandoned.

[30] Foreign Application Priority Data

Aug. 24, 1995 [DE] Germany ............... 195 31 031

[51] Int. Cl.[7] ............... B05D 1/18; F26B 5/00; B01D 12/00
[52] U.S. Cl. .................. 427/443.2; 427/430.1; 438/906; 34/340; 34/342; 34/357
[58] Field of Search ............ 438/906; 427/443.2, 427/372.2, 430.1; 34/339, 340, 341, 342, 357, 443, 448; 134/3, 11

[56] References Cited

U.S. PATENT DOCUMENTS

| | | | |
|---|---|---|---|
| 3,728,785 | 4/1973 | Schmidt | 29/588 |
| 3,869,313 | 3/1975 | Jones et al. | 134/73 |
| 4,169,807 | 10/1979 | Zuber | 252/171 |
| 4,588,571 | 5/1986 | Bildl et al. | 423/348 |
| 4,722,752 | 2/1988 | Steck | 134/25.4 |
| 4,724,619 | 2/1988 | Poli et al. | 34/58 |
| 4,902,350 | 2/1990 | Steck | 134/1 |
| 5,082,518 | 1/1992 | Molinaro | 156/345 |
| 5,361,128 | 11/1994 | Bourbina et al. | 356/36 |
| 5,445,679 | 8/1995 | Hansen et al. | 134/1 |
| 5,569,330 | 10/1996 | Schild et al. | 134/1 |
| 5,571,337 | 11/1996 | Mohindra et al. | 134/25.4 |

FOREIGN PATENT DOCUMENTS

| | | | |
|---|---|---|---|
| 0385536 | 9/1990 | European Pat. Off. | H01L 21/00 |
| 385536 | 9/1990 | European Pat. Off. | |
| 1581418 | 12/1980 | United Kingdom | C01B 33/02 |
| 9508406 | 3/1995 | WIPO | B08B 3/00 |

OTHER PUBLICATIONS

Marra, J., "Ultraclean Marangoni Drying," Particles in Gases and Liquids 3 Detection, Characterization, and Control, pp. 269–282 (K.L. Mittal et al.), 1993.

Mara, J., "Ultraclean Marangoni Drying," Particles in Gases and Liquids 3 Detection, Characterization, and Control, pp. 269–282 (K.L. Mittal et al., 1993).

Patents Abstracts of Japan, vol. 18, No. 456 (C–1242), Aug. 25, 1994, JP 6–144822, Production of Highly Pure Fine Silicon Particle and Production of Highly Pure Polycrystalline Silicon Using the Same Particle (Tonen Chemical Corp.), May 24, 1994.

Patent Abstracts of Japan, vol. 17, No. 259 (C–1061), May 21, 1993, JP5–4811, Method for Cleansing Polycrystalline Silicon (Shin Etsu Handotai Co Ltd), Jan. 14, 1993.

Patent Abstracts of Japan, vol. 16, No. 269 (C–0952), Jun. 17, 1992, JP4066175, Drain–Drying Method (Seiko Epson Corp), Mar. 2, 1992.

Primary Examiner—Shrive Beck
Assistant Examiner—Michael Barr
Attorney, Agent, or Firm—Stoel Rives LLP

[57] ABSTRACT

The invention relates to a procedure applicable for drying substrate surfaces of a large number of materials, such as semiconductors, metals, plastics and, in particular, silicon. The silicon (1) is dipped into a liquid bath (2) and the silicon (1) is separated from the liquid (3), the liquid of the bath (2) consisting of an aqueous HF solution (3) with a concentration between 0.001 and 50%. By removing the silicon from the bath at a speed of between 0.1 cm/sec and 20 cm/sec, the bath liquid drains from the hydrophobic surface to provide a clean, dry substrate.

14 Claims, 2 Drawing Sheets

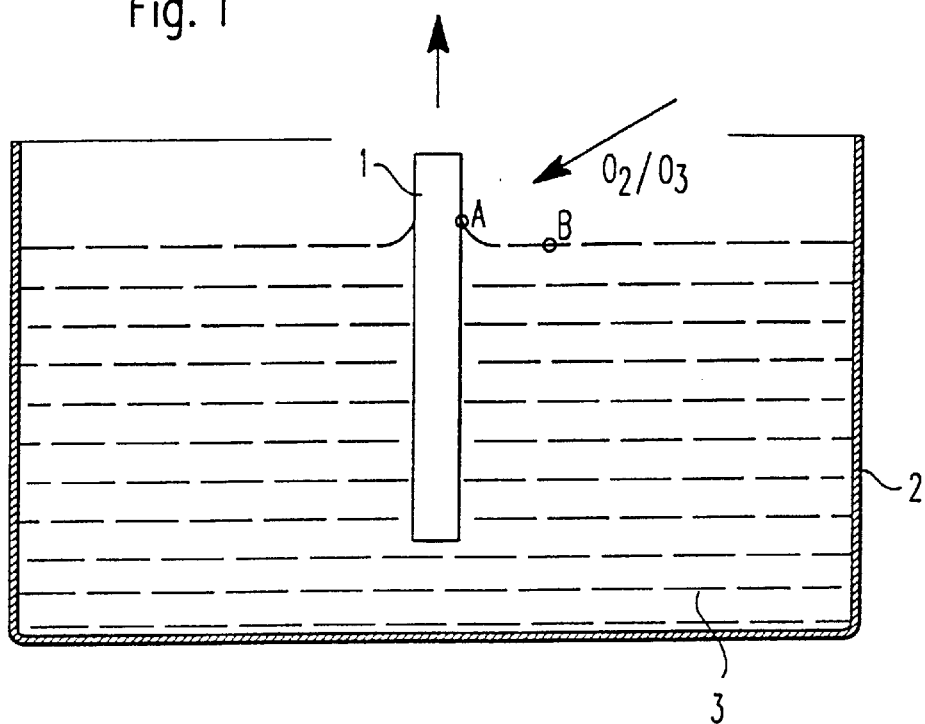
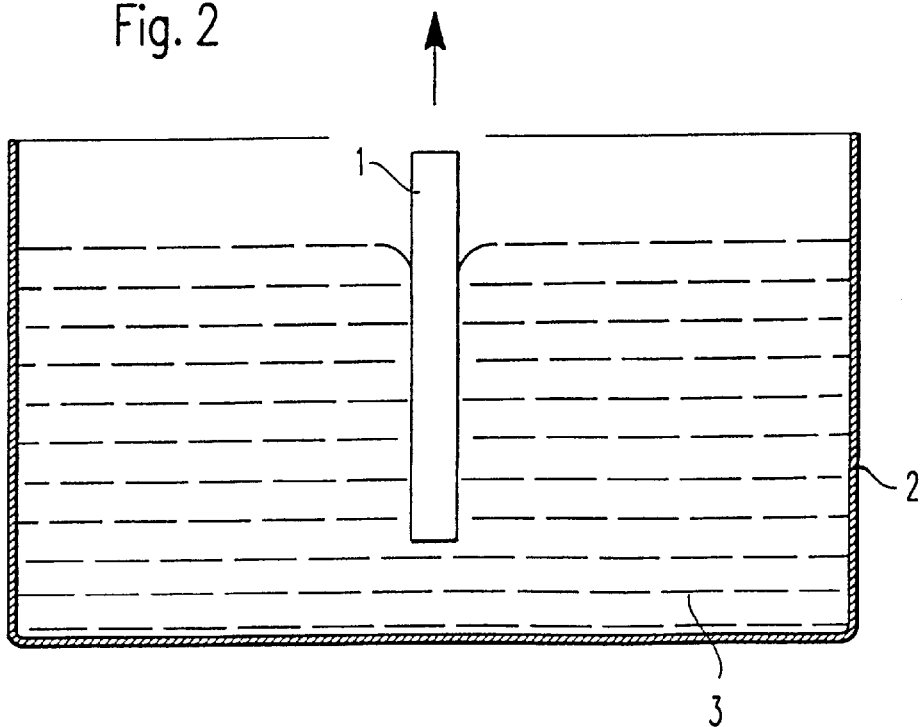

PROCEDURE FOR THE DRYING OF SILICON

RELATED APPLICATIONS

This application is a divisional application of U.S. Pat. application Ser. No. 08/692,169 filed Aug. 5, 1996 and issued Feb. 3, 1998 as U.S. Pat. No. 5,714,203, which is a continuation-in-part of U.S. Pat. application Ser. No. 08/667,388 filed Jun. 21, 1996, now abandoned.

TECHNICAL FIELD

The invention relates to a procedure for cleanly drying surfaces of materials, such as semiconductors, ceramics, metals, glasses, plastics and, in particular, silicon wafers and laser disks, wherein a substrate is dipped in a liquid bath and its surfaces are dried as it is separated from the liquid, such as by directing a gas over the liquid surface, the gas being soluble in the liquid and lowering the surface tension of the liquid.

DESCRIPTION OF THE RELATED ART

When producing microelectronic devices, silicon, which is usually in the form of monocrystalline wafers, is badly contaminated or damaged as a result of cutting, polishing, varnishing or similar procedures. For that reason, the silicon is usually cleaned in multiple steps, which are usually performed in liquid baths.

The different chemical treatments are usually selectively effective for different types of contaminants (ie., particles, organic coatings, functional organic SiR3 groups or metals, which show similar chemical behavior with each other). The chemical treatments are typically separated by rinsing steps to make the silicon surface free of chemicals and to avoid mixtures of chemicals. Superior water purity is important to minimize the risk of recontamination by metals at pH neutrality.

The silicon is at risk of being recontaminated by contaminants, such as particles or metals, of a type that was removed during a prior phase of the cleaning sequence because of contamination present in subsequent rinsing steps or in chemicals, such as stabilizers for $H_2O_2$, used in the subsequent cleaning steps. The total cleaning sequence is finished by a drying step.

Many different drying procedures for silicon surfaces are known. These drying procedures include dry spinning by centrifugal forces and drying by solvents like trichlorethanol or methylenechloride. Furthermore, there are drying techniques using hot air, hot water or isopropyl alcohol. One disadvantage of these popular drying procedures is that immense stress is put on the silicon wafer by high mechanical forces. Accordingly, the danger of damaging the edges is high and, moreover, particle generation caused by movements of the silicon wafers relative to the carrier, is possible. In an extreme case, especially with thinner wafers or after thermal treatments, this stress can result in breaking of the wafer, thus destroying the complete drying object and contaminating the surrounding wafers with particles.

The drying procedures can also lead to high operating costs due to the use of expensive chemicals, the disposal of which is necessary. Finally, one disadvantage of all the procedures mentioned above is the danger of metallic recontamination of the cleaned surfaces during the drying process.

Known procedures for drying silicon are described in the article "Ultraclean Marangoni Drying in Gases and Liquids 3," in *Particles in Gases and Liquids 3: Detection, Characterization and Control*, edited by K. L. Mittal, Plenum Press, New York, 1993, pages 269–282. The procedure described in this article entails dipping silicon wafers into a water bath and then removing the silicon wafers from the water bath by adding an isopropyl alcohol/nitrogen mixture over the surface of the bath. Isopropyl alcohol is soluble in water and lowers the surface tension when solved in water.

The known drying procedure is based on the so-called MARANGONI Principle or MARANGONI effect. This principle is based on the fact that there is a higher concentration of isopropyl alcohol on the slightly upwards curved area between the silicon surface and the water surface when the silicon wafers are removed from the water bath than on the water surface further away from the silicon surface. The higher concentration of isopropyl alcohol in the area between the silicon surface and the water surface causes a lower surface tension there than on the remaining water surface. This gradient in the surface tension causes the water to flow from the silicon surface to the remaining water surface, which results in the drying of the silicon surface. A disadvantage of this procedure is the metallic contamination of the water, which causes a metal contamination of the silicon surface as well. Furthermore, organic residue on the surface, which can be caused by the isopropyl alcohol, can occur. Thus, there is a need for methods for drying the silicon surface without metal and/or other contamination of the silicon surface.

SUMMARY OF THE INVENTION

The invention provides procedures for drying surfaces. The procedures of the invention guarantee the purity of the cleaned surfaces and the effective drying of the surface. The invention is applicable to surfaces of many materials, including semiconductors, metals (particularly aluminum), plastics, glasses, and ceramics. The invention is particularly useful for drying and cleaning laser discs and semiconductor silicon wafers.

In a first embodiment, the invention relates to a procedure for drying a substrate surface, wherein the substrate is dipped into a liquid bath and the substrate and the liquid are subsequently separated while providing a gas over the surface of the liquid, the gas being soluble in the liquid and lowering the surface tension of the liquid. For example, a semiconductor silicon wafer can be dried upon removal from a liquid bath comprising an aqueous HF solution with a concentration between 0.001% and 50% with an $O_2/O_3$ gas mixture provided over the surface of the aqueous HF solution.

In a second embodiment, the invention relates to a method of drying a substrate surface wherein the substrate is dipped into and subsequently separated from a liquid bath and a gas mixture is directed over the surface of the substrate after separating the substrate from the liquid bath. For example, a semiconductor silicon wafer can be dipped into an aqueous HF solution with a concentration of between 0.001% and 50% and a gas mixture comprising $O_2/O_3$ is directed over the silicon wafer surface upon removal from the aqueous HF solution.

Additional objects and advantages of this invention will be apparent from the following detailed description of preferred embodiments thereof which proceeds with reference to the accompanying drawings.

BRIEF DESCRIPTION OF THE DRAWINGS

The invention is now described by reference to the figures in which:

FIG. 1 shows the removal of a silicon wafer from a bath with an aqueous HF solution by adding an $O_2/O_3$ gas mixture.

FIG. 2 shows the removal of a silicon wafer from a bath with an aqueous HF solution without adding $O_2/O_3$.

DETAILED DESCRIPTION OF THE PREFERRED EMBODIMENT

Figure 3A:
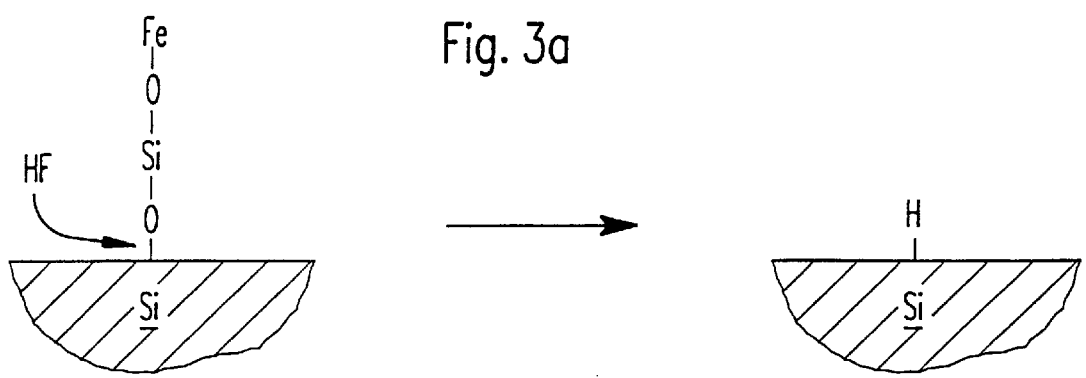
FIGS. 3a–3c shows the chemical processes of the cleaning or hydrophilizing of the silicon surface using the procedures according to the invention.

In a first embodiment, the gas mixture added over the surface of the HF solution contains $O_2/O_3$, and nitrogen or a similar gas can be used as a carrier gas. The carrier gas should be chemically inactive with the $O_2/O_3$ component of the gas mixture. Suitable gases include air ($N_2$, $O_2$, $CO_2$), $CO_2$, He, Ne, Ar, Kr, Xe and Rn. The share of $O_3$ in the $O_2/O_3$ gas mixture is preferably 1 mg up to 0.5 g per liter of $O_2/O_3$ gas mixture. The gas mixture can consist of only $O_2/O_3$. If a carrier gas is used, however, the share of the $O_2/O_3$ gas mixture is preferably greater than 10%.

The silicon atoms active on the surface are changed into Si—H and Si—F bondings. The resulting hydrophobic surface character allows drying even at very low temperatures.

The pH value <7 of an aqueous HF solution during drying prevents metallic recontamination. Furthermore, the HF removes metal contamination in the liquid bath, which exists in an oxidized (=ionized) form like Fe, and keeps it in the liquid as metal fluoride complexes. If ozone is added over the surface of the aqueous HF solution in accordance with the first embodiment of the invention, it dissolves partly in the aqueous HF solution and transfers covalently bonded Si—Me combinations to ionic combinations.

Moreover, when dissolving ozone in the aqueous HF solution, the MARANGONI effect occurs according to the ozone concentration. The silicon surface comes out hydrophilicly from the aqueous HF solution, meaning that it is wettable with water or aqueous solutions.

With the procedure according to the second embodiment of the invention, the gas mixture containing $O_2/O_3$ is directed over the silicon surface only after its drying. Thus, making the silicon surface hydrophilic takes place only after the drying process. The advantage of this procedure is the very quick drying of the silicon.

With both of the above embodiments according to the invention, separating the silicon from the aqueous HF solution can be done either by lifting the silicon out of the HF solution or by down flowing the HF solution, or by a combination of both.

With the procedure according to the first embodiment of invention, the relative speed of separation, which constitutes the speed of removal of the silicon from the solution or the speed of draining of solution from the bath, is about 1 to about 50 mm/sec and preferably about 3 to about 10 mm/sec. Such a low speed is an advantage, since the MARANGONI effect is especially effective at low speeds. With the procedure according to the second embodiment of the invention, the relative speed of separation between the silicon and the surface of the solution is about 0.1 to about 20 cm/sec and preferably about 0.5 to about 3.0 cm/sec, since the drying can be done very quickly.

Furthermore, the aqueous HF solution can contain additives like organic compounds (such as alcohol, isopropyl alcohol and EDTA), organic acids (such as formic acid, acetic acid and citric acid), acids (such as HCl, $H_3PO_4$, HClO, $HClO_2$, $HClO_3$ and $HClO_4$), surfactants (cationic or anionic) or solid additives like $NH_4F$, provided they do not destroy the effects explained above and effective cleaning and drying of the silicon remain. Acids are added in the amount of 0% to about 50% weight, organic compounds are added in the amount of 0% to about 80% weight, surfactants are added in the amount of 0% to about 5% weight and solids are added in the amount of 0% to about 50% weight. Specific applications are possible, with which a stronger than mentioned effect or better cleaning and drying can be achieved by adding one or more acids to the aqueous HF solution. Preferred acids are HCl, $H_2SO_4$ and $H_3PO_4$ or mixtures thereof. However, any one or more of the acids described above can be added using the ranges listed above. Preferred mixtures of acids are HF/HCl, HF/HCl/$H_2SO_4$, HF/$H_3PO_4$, HF/$H_3PO_4$/HCl, HF/$H_3PO_4$/$H_2SO_4$ and HF/$H_3PO_4$/HCl/$H_2SO_4$. Otherwise the HF solution can be skimmed out to a concentration of c=0 (pure water).

Furthermore, enriching or saturating the aqueous HF solution with ozone before dipping the silicon is an advantage, which results in cleaner silicon surfaces. Multiple mono layers of silicon are oxidized and then eroded. Thus, the cleaning is effective even for metals closely beneath the surface (subsurface contamination).

The HF-concentration is preferably between about 0.01% and about 0.1%. The range can be 0% (pure water) to 90% (concentrated HF).

A stable ozone content comparable with a saturated status can be achieved by continuously supplying the HF solution tank with an $O_2/O_3$ gas stream (for example, "bubbling"). Other parameters like temperature, concentration of HF and adding of additives (mainly surfactants) have an influence on the ozone content and the saturated status. A successful cleaning and drying procedure can be achieved with a continuous $O_2/O_3$ gas stream. In a preferred embodiment, the gas stream is in the range of about 50 to about 300 l/h and the ozone generation is in the range of about 10 to about 50 g/h. An estimated value of the ozone concentration in the HF solution is in the range of 10 to 80 mg/l.

Another advantage of the invention is that the procedure can be carried out in a temperature range between 0 and 100 degrees Celsius, the preferred temperature being 20 to 50 degrees Celsius.

EXAMPLE

FIG. 1 shows a silicon wafer 1, which is slowly removed from a bath 2 with an aqueous HF solution 3 after being dipped completely into the bath. The direction of removal of the silicon wafer 1 is shown by the arrow pointing vertically upwards over the silicon wafer. The speed of removal is preferably about 3 to about 10 millimeters per second. The arrow diagonal to the silicon wafer surface shows the simultaneous adding of the $O_2/O_3$ gas mixture over the aqueous solution near the wafer surface.

When slowly removing the silicon wafer 1 from the aqueous HF solution 3, the surface of the aqueous HF solution sticks to the silicon surface, which is bent upwards. This is shown by an upwards curve of the liquid surface at the area between the surface of the solution and the surface of the silicon wafer 1. At point A more ozone is dissolved than at the other places of the surface of the solution, i.e., shown by point B. Since at point A there is a higher ozone concentration than at point B, there is a lower surface tension at point A than at point B. This gradient in the surface tension causes the aqueous HF solution to ran from point A to point B, drying the silicon surface.

FIG. 2 shows a silicon wafer 1, which is slowly removed from a bath 2 with an aqueous HF solution 3 after having been dipped completely into the bath. The direction of removal is shown by the arrow pointing vertically upwards over the silicon wafer. Because of the hydrophobicity of the silicon wafer, the surface of the liquid is bent downwards at the silicon surface. The hydrophilizing of the silicon surface by ozone takes place only after the drying process is finished.

FIG. 3a shows that the HF solution in the aqueous solution guarantees the eroding of the silicon oxide layers into the metal ions are included.

Figure 3B:
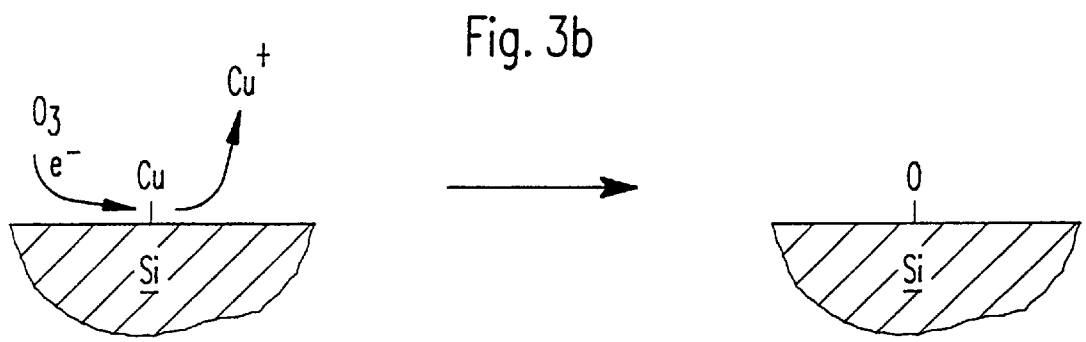

Metal contamination like Cu, which are directly connected to Si atom, are removed by a Redox process, as shown in FIG. 3b.

Figure 3C:
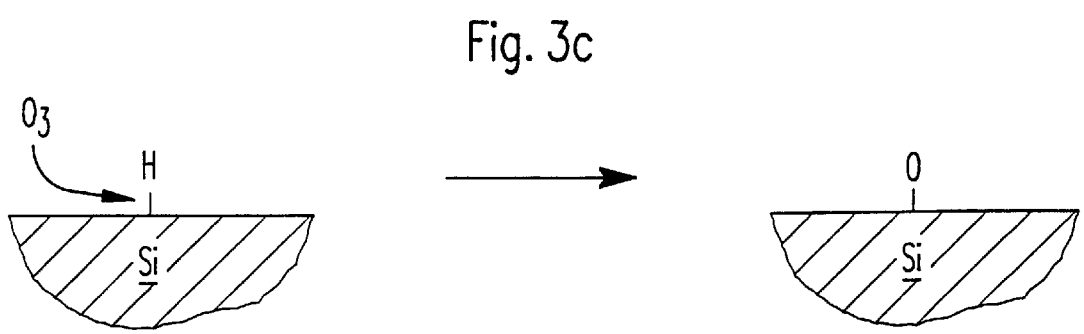

FIG. 3c shows how the ozone causes the silicon surface to oxidize.

Thus, the silicon leaves the drying bath perfectly clean, hydrophilic and dry.

Other embodiments of the invention will be apparent to one of ordinary skill in the art. Although the preferred embodiments and examples describe the drying of silicon wafers, the invention is applicable to substrates of many materials in addition to silicon, such as metals, plastics, glasses, and ceramics. The term "substrate" is not limited to substrates that support electronic circuitry, but applies to any object supporting a surface. The invention is not limited to the specific examples and is defined by the following claims.

What is claimed is:

1. A method of drying a substrate upon removal from a wet chemical processing bath, the drying being accomplished without subjecting the substrate to high mechanical forces and without the introduction of surface contaminate, the substrate upon drying maintaining a surface purity adequate for the fabrication of microelectronic circuits, the method comprising:

dipping the substrate into a wet chemical processing bath containing an aqueous HF solution having an HF concentration in between about 0.01% and about 0.1%, the bath causing the surface on the substrate to become or allowing the surface to remain hydrophobic upon separation of the substrate from the bath; and separating the substrate from the bath at a temperature between 0 and 50 degrees Celsius and at a sufficiently slow rate of between about 0.1 cm/sec and about 20 cm/sec so that the surface tension of the aqueous acid solution causes it to withdraw from the hydrophobic surface of the substrate, thereby producing an essentially dry substrate upon removal from the bath.

2. The method of claim 1 wherein the substrate comprises silicon.

3. The method of claim 1 wherein the relative speed of separation between the substrate and the liquid of bath is between about 0.5 cm/sec and about 3.0 cm/sec.

4. The method of claim 1 wherein the substrate is separated from the liquid of the bath by lifting the substrate out of the bath.

5. The method of claim 1 wherein the substrate is separated from the liquid of the bath by draining the bath.

6. The method of claim 1 wherein the aqueous HF solution contains at least one additive selected from the group consisting of acids, organic acids, surfactants and solid additives.

7. The method of claim 6 wherein said at least one additive is an acid selected from the group consisting of HCl, $H_3PO_4$, $H_2SO_4$, HClO, $HClO_2$, $HClO_3$ and $HClO_4$.

8. The method of claim 6 wherein said aqueous solution contains a mixture of additional acids selected from the group consisting of $HCl/H_2PO_4$, $H_3PO_4/HCl$, $H_3PO_4/H_2SO_4$ and $H_3PO_4/HCl/H_2SO_4$.

9. The method of claim 6 wherein said at least one additive is an organic acid selected from the group consisting of formic acid, acetic acid and citric acid.

10. The method of claim 6 wherein said solid additive is $NH_4F$.

11. The method of claim 1 in which the bath comprises a rinsing bath.

12. The method of claim 1 in which the substrate comprises a ceramic substrate suitable for the fabrication of microelectronics.

13. The method of claim 1 in which the substrate comprises an aluminum substrate suitable for the fabrication of microelectronics.

14. The method of claim 1 in which the substrate comprises material for a laser disc.

* * * * *